United States Patent
Nomaru (10) Patent No.: US 8,319,143 B2
(45) Date of Patent: Nov. 27, 2012

(54) LASER PROCESSING APPARATUS

(75) Inventor: Keiji Nomaru, Ota-ku (JP)

(73) Assignee: Disco Corporation, Tokyo (JP)

( * ) Notice: Subject to any disclaimer, the term of this patent is extended or adjusted under 35 U.S.C. 154(b) by 665 days.

(21) Appl. No.: 12/534,705

(22) Filed: Aug. 3, 2009

(65) Prior Publication Data

US 2010/0044355 A1    Feb. 25, 2010

(30) Foreign Application Priority Data

Aug. 25, 2008   (JP) ................. 2008-214853

(51) Int. Cl.
*B23K 26/00*   (2006.01)
*B23K 26/06*   (2006.01)
*B23K 26/02*   (2006.01)

(52) U.S. Cl. ........... 219/121.6; 219/121.67; 219/121.75; 219/121.82

(58) Field of Classification Search ............... 219/121.6, 219/121.61, 121.65, 121.67, 121.71, 121.75, 219/121.82

See application file for complete search history.

(56) References Cited

U.S. PATENT DOCUMENTS

| | | | |
|---|---|---|---|
| 2005/0007906 A1* | 1/2005 | Horinouchi et al. | 369/44.37 |
| 2007/0057184 A1* | 3/2007 | Uto et al. | 250/310 |
| 2008/0031103 A1* | 2/2008 | Horinouchi et al. | 369/44.37 |
| 2009/0166340 A1* | 7/2009 | Arai et al. | 219/121.7 |

FOREIGN PATENT DOCUMENTS

| | | |
|---|---|---|
| JP | A 10-305420 | 11/1998 |
| JP | A 2002-192370 | 7/2002 |
| JP | A 2007-152355 | 6/2007 |
| JP | A 2008-16577 | 1/2008 |
| JP | A 2008-68308 | 3/2008 |

* cited by examiner

*Primary Examiner* — Hsien Ming Lee
(74) *Attorney, Agent, or Firm* — Greer, Burns & Crain, Ltd.

(57) ABSTRACT

A laser processing apparatus having a holding unit for holding a workpiece to be processed and a processing unit for applying a laser beam to the workpiece held by the holding unit. The processing unit includes an oscillator for oscillating the laser beam, a focusing lens for focusing the laser beam oscillated by the oscillator toward the workpiece, and a focal position adjusting mechanism for adjusting the focal position of the laser beam focused by the focusing lens. The focal position adjusting mechanism includes a movable unit having a permanent magnet and supporting the focusing lens, a fixed portion having a coil for moving the movable unit in a direction perpendicular to the workpiece and a gas bearing for supporting the movable unit by using a gas, and a supporting member for supporting the movable unit from the under side by using a magnetic repulsive action.

4 Claims, 6 Drawing Sheets

LASER PROCESSING APPARATUS

BACKGROUND OF THE INVENTION

1. Field of the Invention

The Present Invention Relates Generally to a Laser processing apparatus for processing a workpiece such as a semiconductor wafer by using a laser beam, and more particularly to a technique for correcting the focal position of the laser beam.

2. Description of the Related Art

In a semiconductor device fabrication process, a plurality of circuits such as ICs (integrated circuits) and LSIs (large-scale integrated circuits) are formed like a matrix on the surface of a substantially disk-shaped semiconductor wafer, and this wafer thus formed with the plural circuits is next cut along a plurality of crossing streets (division lines) to thereby divide the plural circuits from each as chips. Also in a fabrication process for optical devices such as light emitting diodes and laser diodes widely used in electrical equipment, a gallium nitride compound semiconductor or the like is formed on the surface of a substrate such as a sapphire substrate to obtain an optical device wafer, and this wafer is next cut along a plurality of division lines to divide individual optical devices from each other as chips.

Cutting (dicing) of such various wafers is performed by using a cutting apparatus called a dicer. As another method, there has recently been developed a method of cutting a workpiece such as a semiconductor wafer by using a laser beam (see Japanese Patent Laid-open No. Hei 10-305420 and Japanese Patent No. 3408805, for example). Japanese Patent Laid-open No. Hei 10-305420 discloses a laser processing method such that a laser beam is applied to a workpiece formed from a single crystal oxide to dissociate and evaporate the molecules of the single crystal oxide by a photochemical reaction, thereby forming a groove at a predetermined position on the workpiece. Then, the workpiece is cleaved along this groove.

Japanese Patent No. 3408805 discloses a laser cutting method such that a pulsed laser beam having a transmission wavelength to a workpiece is applied to the workpiece in the condition where the focal position of the laser beam is set inside the workpiece, thereby forming a modified layer along each division line. This modified layer is smaller in strength than the other region of the workpiece. Accordingly, by applying an external force along each division line, the workpiece is divided along each division line in such a manner that the division is started from the modified layer.

In some workpieces to be processed, there is a possibility that warpage or undulation may occur or the surface of the workpiece may not become flat to cause the formation of roughness during any process steps before a dicing step. In the case of processing such a workpiece, the surface displacement of a subject surface of the workpiece is not constant, so that the focal position of the laser beam varies in a direction along the thickness of the workpiece, causing a reduction in processing accuracy. In the laser processing method for forming a modified layer inside the workpiece as mentioned above, the effect of warpage, undulation, and roughness of the workpiece is especially profound. To cope with this problem, there has been proposed a laser processing apparatus including means for measuring the surface displacement in a laser beam applying region of the workpiece, means for adjusting the focal position of a laser beam in a direction along the thickness of the workpiece according to the result of measurement by the above measuring means, and means for applying the laser beam to the workpiece (see Japanese Patent Laid-open No. 2007-152355 and Japanese Patent Laid-open No. 2008-16577, for example).

Further, there has also been proposed a laser processing apparatus using a voice coil motor having a high-speed response capability to adjust the focal position of a laser beam (see Japanese Patent Laid-open No. 2008-68308, for example). In the laser processing apparatus described in Japanese Patent Laid-open No. 2008-68308, a magnet is built in a supporting portion for supporting a focusing lens, and a coil is provided in a casing surrounding the magnet, wherein the supporting portion is moved by using a driving force of the coil, thereby adjusting the position of the focusing lens.

However, these conventional laser processing apparatuses have the following problems. In the laser processing apparatus described in Japanese Patent Laid-open Nos. 2007-152355 and 2008-16577 mentioned above, an actuator using a piezoelectric element is used to adjust the focal position of the laser beam. In general, such an actuator has a problem such that a movable part can travel by a short distance and the adjustable range of the focal position is therefore narrow. On the other hand, in the laser processing apparatus described in Japanese Patent Laid-open No. 2008-68308 mentioned above, a ball bearing is used in the voice coil motor. Accordingly, a static friction resistance is produced between the movable part and the ball bearing in the voice coil motor, causing a reduction in response speed. This laser processing apparatus has another problem such that overshoot occurs in the case that the range of movement of the movable part is hundreds of micrometers or less, particularly 200 μm or less.

SUMMARY OF THE INVENTION

It is therefore an object of the present invention to provide a laser processing apparatus which can adjust the focal position of a laser beam at a high speed in a wide range.

In accordance with an aspect of the present invention, there is provided a laser processing apparatus having holding means for holding a workpiece to be processed and processing means for applying a laser beam to the workpiece held by the holding means, the processing means including an oscillator for oscillating the laser beam; a focusing lens for focusing the laser beam oscillated by the oscillator toward the workpiece; a movable portion for supporting the focusing lens and moving the focusing lens in a direction perpendicular to the workpiece; a fixed portion having a gas bearing portion for supporting the movable portion by using a gas, the fixed portion and the movable portion constituting a voice coil motor; and a supporting member for supporting the movable portion from the under side by using a magnetic repulsive action.

In the present invention, the movable portion and the fixed portion constitute a voice coil motor, and the position of the focusing lens is adjusted by a magnetic attractive/repulsive force generated between a magnetic field due to a current passing through a coil and a magnetic field formed by a magnet. Accordingly, high-speed response and an increase in the range of movement of the movable portion can be realized. Further, the movable portion for holding the focusing lens is supported by a gas bearing, thereby reducing a static friction resistance. As a result, fine adjustment of the focal position of the laser beam can be attained to thereby improve the accuracy of correction of the focal position.

Preferably, the movable portion includes a permanent magnet, and the fixed portion includes a coil portion for driving the movable portion. With this configuration, no wiring is required to be connected to the movable portion, so that an unintentional force is not applied to the movable portion.

More preferably, the movable portion includes a lens supporting member formed from an annular permanent magnet for supporting the focusing lens, a pair of rod members supported by the gas bearing portion, and a connecting member for connecting the lens supporting member and the rod members; the coil portion being located so as to surround the lens supporting member. Preferably, the range of movement of the movable portion is 200 µm or less.

According to the present invention, a voice coil motor is used for the position adjusting mechanism for adjusting the position of the focusing lens, and the movable portion of the voice coil motor is supported by a gas bearing. Accordingly, the focal position of the laser beam can be adjusted at a high speed in a wide range.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENT

Figure 1:
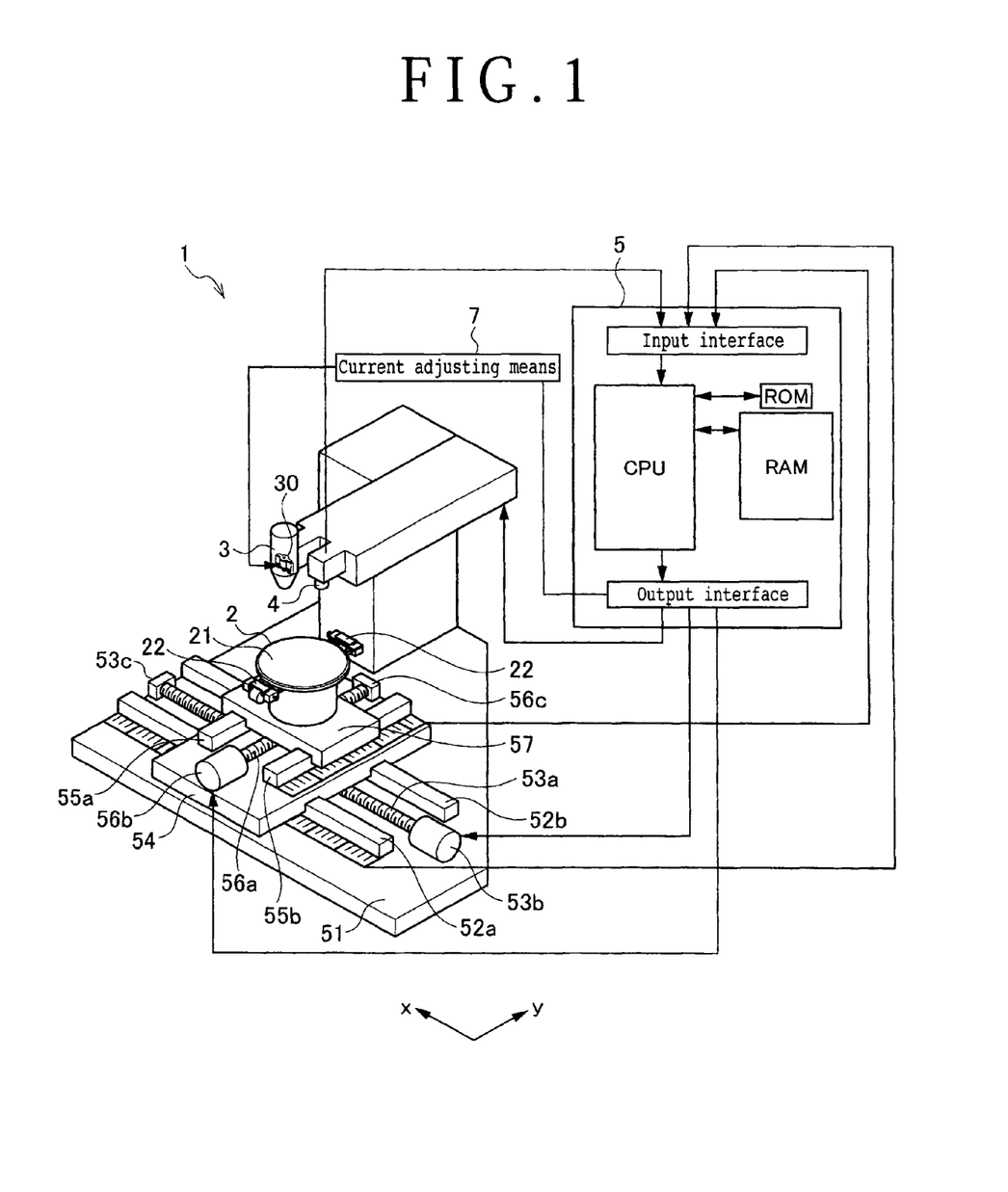
FIG. 1 is a schematic view showing the configuration of a laser processing apparatus according to a preferred embodiment of the present invention.
Figure 2:
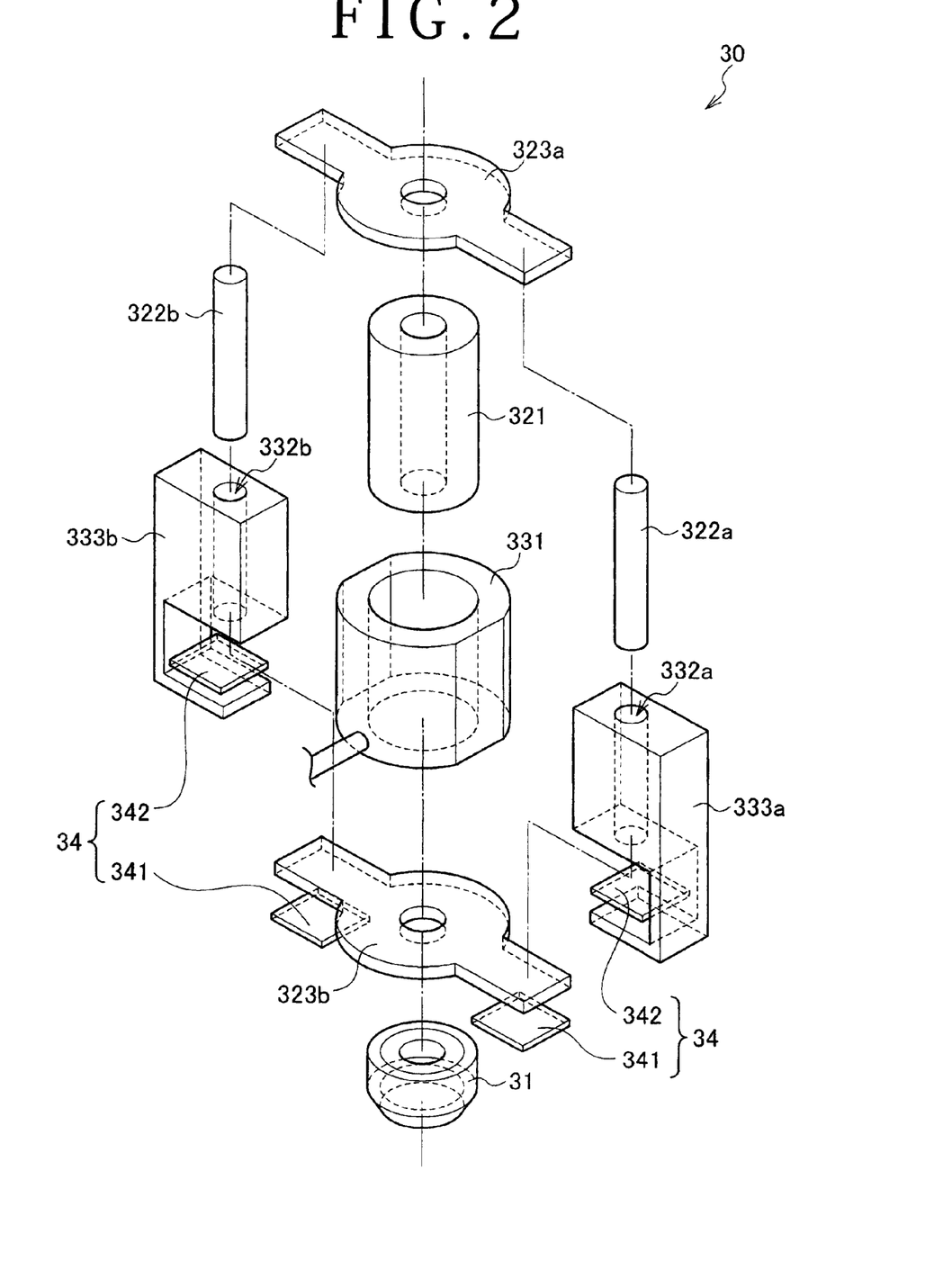
FIG. 2 is an exploded perspective view showing the configuration of a focal position adjusting mechanism in the laser processing apparatus shown in FIG. 1.
Figure 3:
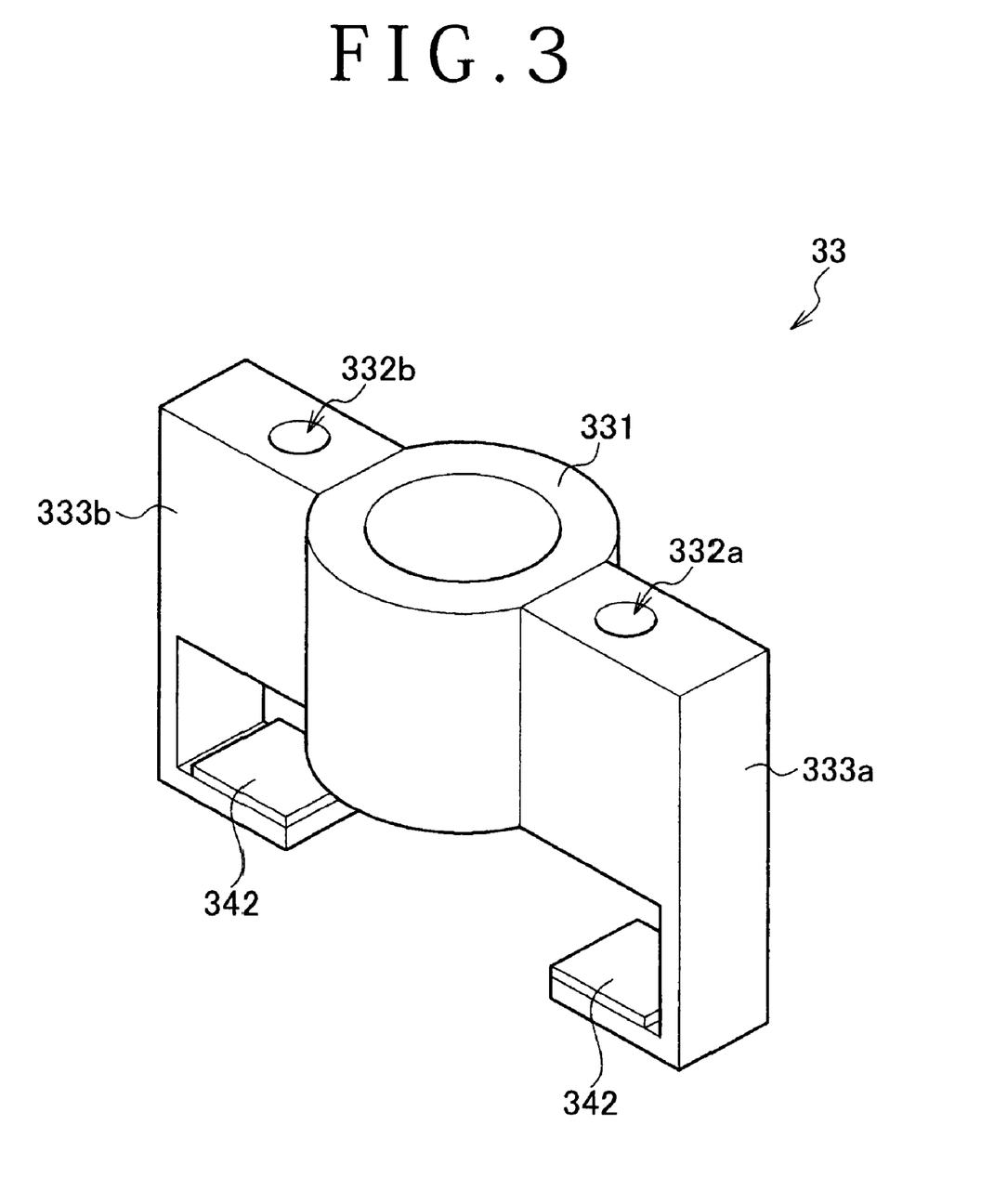
FIG. 3 is a perspective view showing a fixed portion of the focal position adjusting mechanism shown in FIG. 2.
Figure 4:
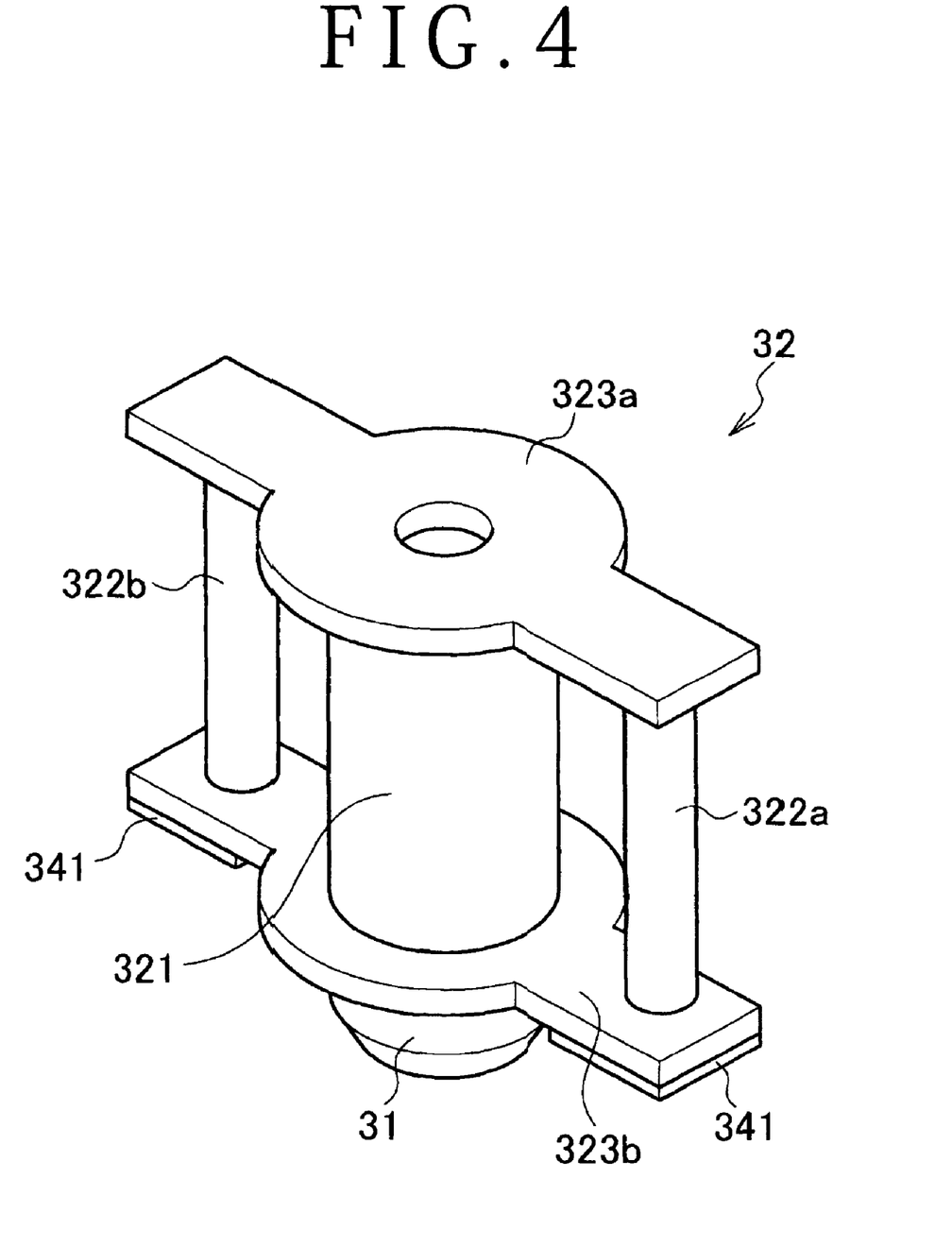
FIG. 4 is a perspective view showing a movable portion of the focal position adjusting mechanism shown in FIG. 2.

A preferred embodiment of the present invention will now be described with reference to the attached drawings. It should be noted that the present invention is not limited to the following preferred embodiment. FIG. 1 is a schematic view showing the configuration of a laser processing apparatus 1 according to the preferred embodiment. FIG. 2 is an exploded perspective view showing the configuration of a focal position adjusting mechanism in the laser processing apparatus 1 shown in FIG. 1. FIG. 3 is a perspective view showing a fixed portion of the focal position adjusting mechanism shown in FIG. 2, and FIG. 4 is a perspective view showing a movable portion of the focal position adjusting mechanism shown in FIG. 2.

As shown in FIG. 1, the laser processing apparatus 1 according to the preferred embodiment essentially includes holding means 2 for holding a workpiece and processing means 3 for applying a laser beam to a predetermined position on the workpiece. The holding means 2 of the laser processing apparatus 1 essentially includes a holding surface 21 for holding the workpiece thereon. For example, the holding means 2 is provided by a chuck table for holding the workpiece under suction. The holding means 2 further includes a plurality of clamps 22 for detachably fixing a ring frame (not shown) supporting the workpiece as required.

The holding means 2 is movable in an X direction and a Y direction perpendicular to the X direction by feeding means.

More specifically, this feeding means has the following configuration. A pair of parallel guide rails 52a and 52b are provided on a base 51 and a ball screw 53a is arranged between the guide rails 52a and 52b in parallel thereto. A motor 53b is mounted at one end of the ball screw 53a, and the other end of the ball screw 53a is rotatably supported to a bearing block 53c.

Further, a sliding block 54 is movably provided on the guide rails 52a and 52b and the ball screw 53a. A pair of parallel guide rails 55a and 55b are provided on the sliding block 54 and a ball screw 56a is arranged between the guide rails 55a and 55b in parallel thereto. A motor 56b is mounted at one end of the ball screw 56a, and the other end of the ball screw 56a is rotatably supported to a bearing block 56c. Further, a sliding block 57 is movably provided on the guide rails 55a and 55b and the ball screw 56a. The holding means 2 is provided on the sliding block 57.

The feeding means having the above configuration is operated in the following manner. When the ball screw 53a is driven by the motor 53b, the sliding block 54 is moved in the X direction as being guided by the guide rails 52a and 52b, thereby moving the holding means 2 in the X direction. On the other hand, when the ball screw 56a is driven by the motor 56b, the sliding block 57 is moved in the Y direction as being guided by the guide rails 55a and 55b, thereby moving the holding means 2 in the Y direction.

The processing means 3 essentially includes an oscillator (not shown) for oscillating a processing laser beam, a focusing lens 31 (shown in FIG. 2) for focusing the laser beam oscillated from the oscillator to the workpiece, and a mechanism (focal position adjusting mechanism 30) for adjusting the focal position of the laser beam focused by the focusing lens. The oscillator of the processing means 3 is suitably selected according to the kind of the workpiece, the form of processing, etc. For example, a YAG laser oecilator or a YVO4 laser oscillator may be used. The processing means 3 in the laser processing apparatus 1 may further include one or more mirrors provided between the oscillator and the focusing lens for changing the traveling direction of the laser beam.

As shown in FIGS. 2 to 4, the focal position adjusting mechanism 30 is composed of a movable portion 32, a fixed portion 33, and a pair of supporting members 34 for supporting the movable portion 32 from the under side thereof. The focusing lens 31 is supported to the movable portion 32. The movable portion 32 of the focal position adjusting mechanism 30 essentially includes a permanent magnet and is capable of supporting the focusing lens 31. For example, as shown in FIG. 4, the movable portion 32 is composed of a lens supporting member 321 formed from an annular permanent magnet, a pair of rod members 322a and 322b, and a pair of connecting members 323a and 323b for connecting the lens supporting member 321 and the rod members 322a and 322b. The focusing lens 31 is located inside the lens supporting member 321.

The fixed portion 33 essentially includes a coil portion 331 for moving the movable portion 32 in a direction perpendicular to the workpiece and a pair of gas bearing portions 332a and 332b for supporting the movable portion 32 by using a gas. For example, in the case where the movable portion 32 is configured as shown in FIG. 4, the fixed portion 33 is configured as shown in FIG. 3. That is, the coil portion 331 of the fixed portion 33 has a cylindrical shape capable of surrounding the lens supporting member 321 of the movable portion 32 as having an inner diameter larger than the outer diameter of the lens supporting member 321. Further, the coil portion 331 and the gas bearing portions 332a and 332b are integrated with each other through a pair of connecting members 333a and 333b. In this case, the coil portion 331 is arranged so as to surround the lens supporting member 321.

In the laser processing apparatus 1 according to this preferred embodiment, the lens supporting member 321 and the coil portion 331 cooperatively function as a voice coil motor. Accordingly, the movable portion 32 is moved in a direction perpendicular to the workpiece within a range of 200 μm or less, for example, thereby adjusting the focal position of the laser beam. The lens supporting member 321 is supported over the circumference thereof by the coil portion 331, so that no moments in the X and Y directions are applied to the lens supporting member 321, thereby stabilizing the operation of the lens supporting member 321.

The supporting members 34 essentially has a configuration capable of supporting the movable portion 32 from the under side thereof by using a magnetic repulsive action. For example, as shown in FIGS. 2 to 4, a pair of permanent magnets 341 and 342 having the same poles are mounted on the connecting member 323a of the movable portion 32 and the connecting members 333a of the fixed portion 33 so as to be opposed to each other. Similarly, a pair of permanent magnets 341 and 342 having the same poles are mounted on the connecting member 323b of the movable portion 32 and the connecting member 333b of the fixed portion 33 so as to be opposed to each other. In this manner, a magnetic repulsive action of the permanent magnets 341 and 342 having the same poles in each pair of supporting member 34 is utilized. Accordingly, when no current is passed through the coil portion 331 and the voice coil motor is therefore inoperative, the movable portion 32 can be held at a predetermined position in a floating condition.

When the voice coil motor is inoperative and the movable portion 32 is in a floating condition, the movable portion 32 minutely vibrates. In the laser processing apparatus 1 according to this preferred embodiment, a minimum current for stopping this vibration of the movable portion 32 is passed through the coil portion 331 and a position where the vibration of the movable portion 32 is stopped is set to an initial position. Accordingly, when a current is passed through the coil portion 331 to operate the voice coil motor, the movable portion 32 can be moved upward and downward by the same distance by supplying the same current value, so that the control of the movable portion 32 can be facilitated. Further, a current for floating the movable portion 32 is not required and it is not necessary to set the position of the movable portion 32 in the current passing condition of the coil portion 331 to the initial position. Accordingly, power consumption can be reduced and heat generation can also be suppressed.

As shown in FIG. 1, the laser processing apparatus 1 according to this preferred embodiment further includes surface displacement detecting means 4 for detecting a surface displacement of the workpiece and control means 5 for controlling the operation of the focal position adjusting mechanism 30 according to the result of detection by the surface displacement detecting means 4. The surface displacement detecting means 4 is not limited in its configuration and detecting method provided that it can detect a surface displacement indicative of undulation or roughness of the surface of the workpiece. For example, light applying means including a laser oscillator and light detecting means such as a sensor are provided above the holding means 2, wherein light having a wavelength reflecting on the surface of the workpiece is applied from the light applying means to the workpiece and reflected light from the surface of the workpiece is detected by the light detecting means. In this case, the light quantity of the reflected light is measured in the light detecting means, and variations in distance from the surface of the workpiece to the light detecting means can be obtained from changes in measured value for the light quantity of the reflected light. That is, the surface displacement of the workpiece can be obtained.

As shown in FIG. 1, the control means 5 is provided by a computer, which includes a central processing unit (CPU) for performing computations according to a control program, a read only memory (ROM) preliminarily storing the control program, etc., a random access memory (RAM) for storing computational results, etc., an input interface for inputting an output signal from the light detecting means of the surface displacement detecting means 4, and an output interface for outputting operation signals to the focal position adjusting means 30 of the processing means 3 and the motors 53b and 56b of the feeding means.

There will now be described the operation of the laser processing apparatus 1 according to this preferred embodiment, i.e., a method of processing the workpiece by using the laser processing apparatus 1. Examples of the workpiece to be processed by the laser processing apparatus 1 may include a semiconductor wafer, an adhesive tape such as a DAF (Die Attach Film), various substrates formed of inorganic materials such as glass, silicon, and sapphire, metallic materials, or plastic materials, a semiconductor product package, and various work materials required to ensure an accuracy on the order of micrometers. The workpiece is processed in the condition where it is supported through an adhesive tape to an opening portion of the ring frame, wherein the adhesive tape is attached to the back side of the workpiece.

In the laser processing method using the laser processing apparatus 1 according to this preferred embodiment, the workpiece supported to the ring frame is placed on the holding means 2. In this condition, the ring frame is fixed by the clamps 22 and the workpiece is held on the holding surface 21 under suction. Thereafter, the processing means 3 is operated to apply processing laser beam having a predetermined wavelength to the workpiece along each division line. At this time, the surface displacement detecting means 4 is operated to detect the surface displacement in a laser beam applying region, i.e., on each division line, and the control means 5 is operated to control the operation of the focal position adjusting means 30 according to the result of detection by the surface displacement detecting means 4, thus adjusting the focal position of the laser beam in a direction along the thickness of the workpiece.

Figure 5:
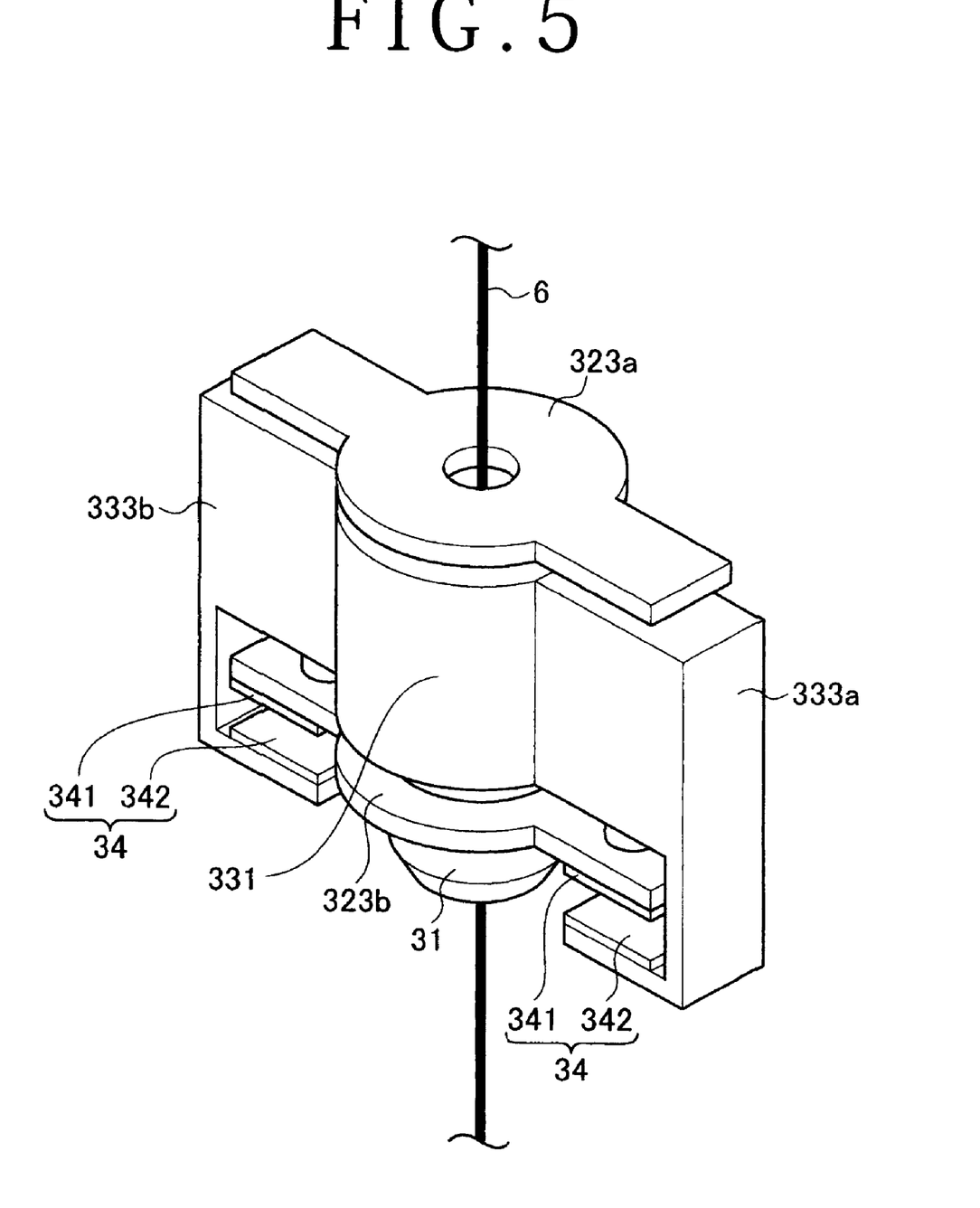
FIG. 5 is a perspective view showing the operation of the focal position adjusting mechanism shown in FIG. 2.
Figure 6:
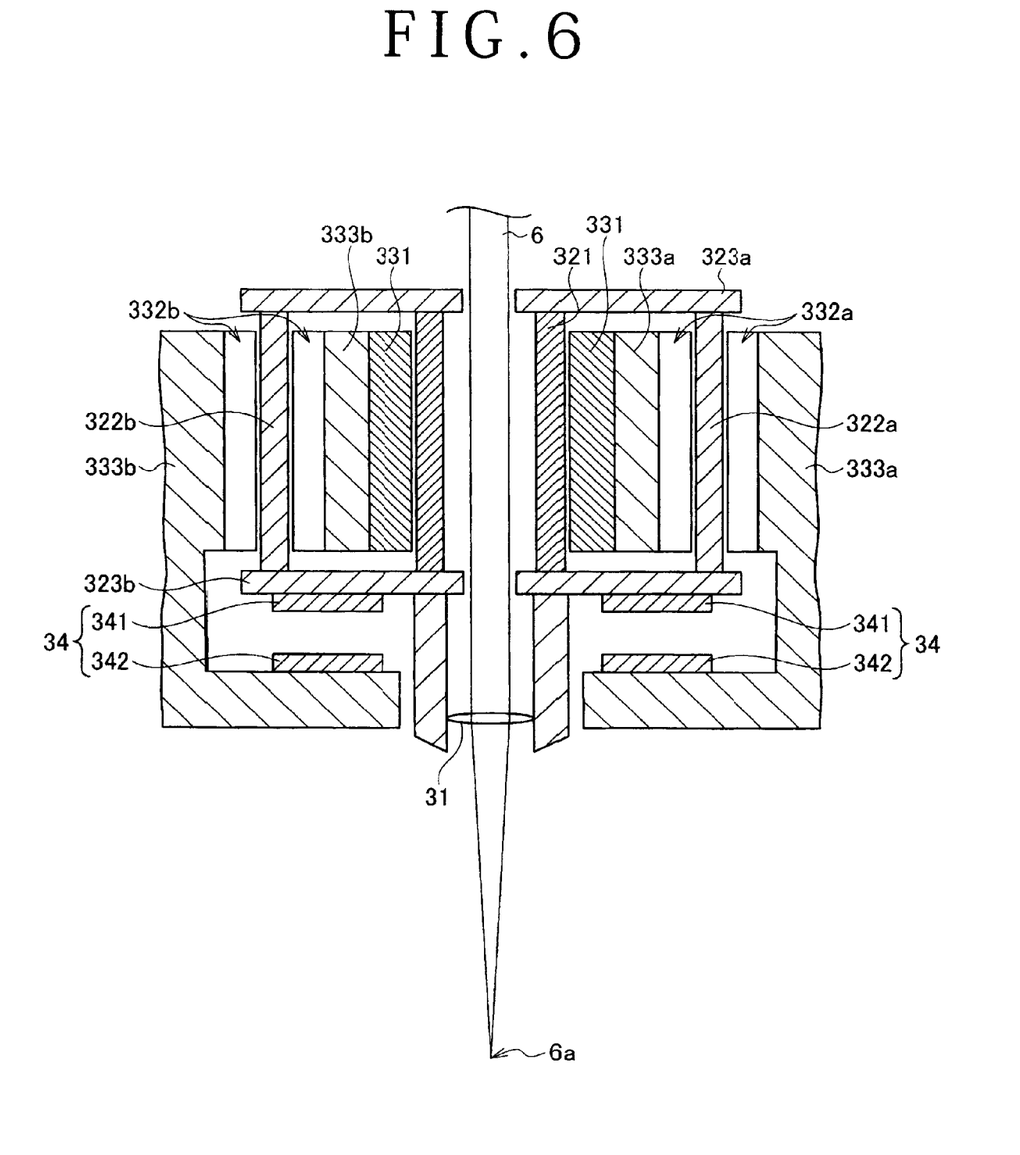
FIG. 6 is a sectional view showing the operation of the focal position adjusting mechanism shown in FIG. 2.

FIG. 5 is a perspective view showing the operation of the focal position adjusting mechanism 30, and FIG. 6 is a sectional view showing the operation of the focal position adjusting mechanism 30. As shown in FIGS. 5 and 6, a processing laser beam 6 is passed through the lens supporting member 321 along its axis and is focused toward the workpiece by the focusing lens 31. The position of the focal point 6a of the laser beam 6 is adjusted by moving the movable portion 32 in a direction perpendicular to the workpiece.

More specifically, current adjusting means 7 is operated by the control means 5 according to the result of detection by the surface displacement detecting means 4 as shown in FIG. 1, thereby changing the current value supplied to the coil portion 331. As a result, there occurs a change in magnetic attractive/repulsive force generated between a magnetic field due to the passage of a current through the coil portion 331 and a magnetic field formed by the permanent magnet constituting the lens supporting member 321, so that the position of the movable portion 32 can be adjusted. In this case, the range of movement of the movable portion 32 can be arbitrarily set within the range of 200 μm or less, for example.

The gas bearing portions 332a and 332b contain a gas such as air at a predetermined pressure to thereby support the rod members 322a and 322b of the movable portion 32 in a direction perpendicular to the direction of movement of the movable portion 32. Thus, the movable portion 32 is supported by gas bearing, so that a static friction resistance to the movable portion 32 can be reduced to almost zero, thereby eliminating the problem of overshoot. As a result, high-speed response can be achieved and the position of the focusing lens 31 can therefore be adjusted accurately even in the case that the range of movement of the movable portion 32 is hundreds of micrometers or less. For example, a positioning accuracy of about ±60 nm can be realized.

In the laser processing apparatus 1 according to this preferred embodiment, the lens supporting member 321 and the coil portion 331 constitute a voice coil motor, and the movable portion 32 is driven by a force generated due to a magnetic field and a current in the voice coil motor, thereby adjusting the position of the focusing lens 31. Accordingly, high-speed response can be attained and an increase in the range of movement of the movable portion 32 can be realized as compared with a conventional actuator using a piezoelectric element. Further, the movable portion 32 is supported by a gas bearing. Accordingly, a static friction resistance can be greatly reduced and the focal position of the laser beam can therefore be adjusted with a high accuracy.

While the movable portion 32 includes the lens supporting member 321 formed from a permanent magnet and the fixed portion 33 includes the coil portion 331 in the laser processing apparatus 1 according to this preferred embodiment, the present invention is not limited to such a configuration. For example, the movable portion 32 may include a coil and the fixed portion 33 may include a permanent magnet. However, in the case that the fixed portion 33 includes the coil portion 331 as in this preferred embodiment, no wiring is required for the movable portion 32, so that it is possible to prevent that an unintentional force may be applied to the movable portion 32.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A laser processing apparatus having holding means for holding a workpiece to be processed and processing means for applying a laser beam to said workpiece held by said holding means, said processing means comprising:
    an oscillator for oscillating said laser beam;
    a focusing lens for focusing said laser beam oscillated by said oscillator toward said workpiece;
    a movable portion for supporting said focusing lens and moving said focusing lens in a direction perpendicular to said workpiece;
    a fixed portion having a gas bearing portion for supporting said movable portion by using a gas, said fixed portion and said movable portion constituting a voice coil motor; and
    a supporting member for supporting said movable portion from the under side by using a magnetic repulsive action,
    wherein the magnetic repulsive action is created in the direction perpendicular to said workplace by two pairs of permanent magnets, with the permanent magnets of each pair being arranged to oppose each other.

2. A laser processing apparatus having holding means for holding a workpiece to be processed and processing means for applying a laser beam to said workpiece held by said holding means, said processing means comprising:
    an oscillator for oscillating said laser beam;
    a focusing lens for focusing said laser beam oscillated by said oscillator toward said workpiece;
    a movable portion for supporting said focusing lens and moving said focusing lens in a direction perpendicular to said workpiece;
    a fixed portion having a gas bearing portion for supporting said movable portion by using a gas, said fixed portion and said movable portion constituting a voice coil motor; and
    a supporting member for supporting said movable portion from the under side by using a magnetic repulsive action,
    wherein said movable portion includes a permanent magnet, and said fixed portion includes a coil for driving said movable portion.

3. The laser processing apparatus according to claim 2, wherein said movable portion comprises a lens supporting member formed from an annular permanent magnet for supporting said focusing lens, a pair of rod members supported by said gas bearing portion, and a connecting member for connecting said lens supporting member and said rod members; said coil being located so as to surround said lens supporting member.

4. The laser processing apparatus according to claim 1, wherein the range of movement of said movable portion is 200 μm or less.

* * * * *